United States Patent [19]

Wolfe et al.

[11] Patent Number: 5,415,756
[45] Date of Patent: May 16, 1995

[54] ION ASSISTED DEPOSITION PROCESS INCLUDING REACTIVE SOURCE GASSIFICATION

[75] Inventors: John C. Wolfe, Houston; Wong S. Ho, Sugarland; Darian L. Licon; Yat-Lung Chau, both of Houston, all of Tex.

[73] Assignee: University of Houston, Houston, Tex.

[21] Appl. No.: 218,370

[22] Filed: Mar. 28, 1994

[51] Int. Cl.$^6$ ............... C23C 14/00; C23C 14/08; C23C 14/34

[52] U.S. Cl. ............... 204/192.23; 204/192.12; 204/192.15; 204/298.07; 204/298.09; 204/298.12; 427/563; 427/564; 427/578; 427/579

[58] Field of Search ............... 204/192.12, 192.15, 204/192.21, 192.22, 192.23, 192.26, 192.29; 427/563-564, 578-579

[56] References Cited

FOREIGN PATENT DOCUMENTS 139137 12/1979 German Dem. Rep. .... C23C 15/00
61-47645 3/1986 Japan ............... 204/192.23

OTHER PUBLICATIONS

"High-Temperature Oxidation of Metals", John Wiley & Sons Inc. pp. 253-263, Per Kofstad.
"Reaction of Oxygen with Si(111) and (100): Critical Conditions for Growth of SiO2", F. W. Smith and G. Ghidini J. Electrochemical Society, vol. 129, pp. 1300-1306, 1982.

Primary Examiner—Aaron Weisstuch
Attorney, Agent, or Firm—R. Russel Austin

[57] ABSTRACT

A process for depositing a compound of a metal and a reactive gas includes heating a metal target (32), in an evacuated chamber (22) to a predetermined reaction temperature. The reaction temperature is above a critical temperature which is higher than about half the melting point of the metal but below the vaporization temperature of the metal target. At this reaction temperature, the metal target reacts with the reactive gas to produce, in gaseous form, the compound or a sub-compound of the metal and the reactive gas. The gaseous compound or sub-compound is reacted with the reactive gas on a substrate (36) to form a solid layer of the compound on the substrate.

17 Claims, 7 Drawing Sheets

ION ASSISTED DEPOSITION PROCESS INCLUDING REACTIVE SOURCE GASSIFICATION

TECHNICAL FIELD OF THE INVENTION

The present invention relates generally to vacuum deposition methods. It relates in particular to a method of forming a compound of a metal and a reactive gas by reacting a metal target with the reactive gas to form a gaseous compound or sub-compound of the metal and the reactive gas.

DISCUSSION OF BACKGROUND ART

For many years it was believed that thermal evaporation methods were the only methods suitable for economically depositing optical interference layer systems for mirror coatings, anti-reflection coatings and the like. While for many applications sputtering methods were believed to be capable of producing layers of better quality than evaporated layers, they were generally regarded as slow, even after the development of the magnetron sputtering-cathode promised a potential ten-fold increase in then-existing sputter deposition rates.

In recent years, however, sufficient progress has been made in sputtering technology that it has become possible to economically deposit relatively complex, multilayer, optical-interference layer systems, by DC reactive sputtering methods, in large area in-line coating apparatus. In applications where there is sufficient demand for a particular coating type to justify producing the coating in large volumes, for example, volumes totaling about one-million square feet per year or more, it is now possible to produce that coating, by DC reactive sputtering, more economically than is possible using traditional thermal evaporation technology.

The linear magnetron sputtering-cathode has been responsible for providing a basis for the developments that have been made in large scale sputtering technology. In a linear magnetron cathode a magnetic array forms a closed-loop tunnel-field over a sputtering-cathode target. A gas discharge provided by the sputtering process provides electrons, some of which are trapped in the tunnel-field significantly increasing their chances of collision with sputtering gas molecules. This creates a highly-ionized plasma in the tunnel-field area. As a result of this highly-ionized plasma, sputtering rates in the region of the plasma are increased, and, even though the plasma does not cover the entire target area, the deposition rate for a magnetron sputtering-cathode may be about ten times the deposition rate for a non-magnetron cathode having the same area.

During the development of sputtering processes many sophisticated developments directed at improving sputtering uniformity were made. These developments were made by concentrating on areas such as sputtering-gas distribution and anode design, for controlling plasma potential uniformity and stability. As far as increased deposition rates are concerned, however, developments have concentrated simply on finding ways to apply more power to a given target area and to increase the area of the target affected by the race-track-shaped plasma, i.e, increase target utilization.

One solution to the power and utilization problem has been presented by the development of the rotating cylindrical magnetron, wherein the target is of tubular form and rotates about magnetic means forming the tunnel-field. This provides for target utilization of about eighty percent or more, and permits more power to be applied to the target, due to more efficient cooling.

It is emphasized here, however, that, despite the development of sputtering devices such as the rotating cylindrical magnetron, the usual approach to increasing sputter deposition rates is to simply apply as much power as is physically possible to a sputtering device. The limit is usually dictated by how effectively the device can be cooled, generally by flowing water through the device.

A large in-line sputtering device for sputtering architectural glass coatings may consume up to fifty-thousand Kilowatt Hours (50,000 KWH) of electricity in a twenty-four hour period, while depositing only about four-hundred cubic centimeters of coating material. Clearly, this is an inefficient use of power. Only a fraction of the power applied is used to create ions which participate in the sputtering process. The remaining power generates heat which must be removed by the water cooling. The process thus places great demand on precious energy resources and water resources alike.

A further problem, inherent in the DC reactive sputtering process, which has not been solved by any of the recent developments, is that of sputtering-rate control. The problem is as follows.

Typically, in a DC reactive sputtering process, a sputtering gas is supplied which is a mixture of an inert gas and a reactive gas. The reactive gas is usually present in proportions of between about five and twenty-five percent of the gas mixture. If a reactive gas were not present in the mixture, a metal sputtering-target would deposit only metal on a substrate being coated. At a given driving power, and at a given total gas flow-rate, as the percentage of reactive gas is increased, a point is reached where metal deposited on the substrate reacts with the reactive gas to form a compound of the metal and the reactive gas. As the percentage of reactive gas is increased beyond this point, the reactive gas reacts with the metal target to form a layer of the compound on the target. If the reactive gas is oxygen, an oxide is formed on the target. If the oxide is an insulator, positive charge will build up on the target inhibiting further sputtering.

For most metals, the permissible range of oxygen percentage in the sputtering gas, from the onset of oxide deposition on the substrate to the point where target sputtering drops to a near zero rate, is relatively small. For aluminum, for example, this may be only about five percent. If power is increased or decreased, either the gas flow-rate, gas mixture, or both must be changed to establish an optimum deposition condition.

In an in-line sputtering apparatus, substrates to be coated are typically transported at a constant rate past cathodes which are depositing materials of a layer system. Thickness of a given layer in the system is determined by the number of cathodes used to deposit the material of that layer, and the conditions of power, gas flow-rate, and gas mixture composition under which the cathodes are operated. If a layer thickness adjustment is required, it is not unusual to have to adjust all parameters until a new stable deposition point is established. This may take, at a minimum, several minutes, during which time the in-line machine may produce more defective product than a small commercial batch coater would produce good product in a whole day.

Clearly, if in-line coating technology is to be further advanced and more widely applied, a deposition source must be developed which is significantly less wasteful of energy and other natural resources, and in which deposition rate is more readily and responsively adjusted.

SUMMARY OF THE INVENTION

The present invention is directed to a method of vacuum depositing a compound of a metal and a reactive gas by ion assisted gassification. The metal has a vaporization temperature. The vaporization temperature is one of a sublimation temperature or an evaporation temperature.

The method is carried out in a vacuum chamber. The vacuum chamber is provided with means for evacuating the chamber and means for admitting a controlled flow of the reactive gas into the chamber.

A target of the metal is located in the vacuum chamber. The vacuum chamber is also provided with a plasma source or the like for activating the reactive gas. A substrate is located in the chamber for accumulating a layer of the metal compound.

A reactive gas is admitted into the chamber at a predetermined flow-rate and the plasma source is activated for activating the reactive gas. The target is heated to a predetermined reaction temperature sufficient that the reactive gas reacts with the target to form either the compound or a sub-compound of the metal and the reactive gas in gaseous form. The reaction temperature is less than the vaporization temperature of the metal. The gaseous compound or sub-compound and the activated reactive gas react on the substrate, whereby a solid layer of the compound accumulates on the substrate at a predetermined rate. The rate of accumulation of compound on the substrate may be increased or decreased by respectively increasing or decreasing only the rate at which reactive gas is admitted to the chamber.

In one preferred embodiment of the method of the present invention, the target of the metal forms the target of a sputtering-cathode. The sputtering-cathode provides the plasma source for activating the reactive gas and also provides an ion source for bombarding the substrate. The target is heated by ion bombardment by ions from the plasma. The sputtering-cathode may be a magnetron sputtering-cathode or a conventional non-magnetron cathode. The cathode has a cooling system which is arranged such that the target temperature can rise to the reaction temperature and then remain at that temperature.

In certain embodiments of the method of the present invention it may be found advantageous to provide, in addition to the plasma source for delivering reactive gas ions to the metal target, a second ion source for delivering reactive gas ions to the substrate.

In one application of the method of the present invention, silicon dioxide was deposited from a silicon target on a magnetron sputtering-cathode. The reactive gas was oxygen. Silicon dioxide was deposited on a substrate at a rate more than twice that which would be possible due to reactive sputtering of silicon in oxygen alone. The cathode was configured such that the target temperature could rise to about thirteen-hundred-seventy degrees Kelvin (1370° K.) and then remain at that temperature during the deposition process.

It is believed, without being limited to a particular theory, that oxygen first reacts with the silicon target to form solid silicon dioxide. At the predetermined target temperature, solid silicon dioxide reacts with solid silicon metal to form a gaseous sub-oxide of silicon, primarily silicon monoxide. The target thus effectively is sublimed to form silicon monoxide gas which impinges on the substrate. On the substrate, in the absence of solid silicon, the silicon monoxide gas reacts with the activated oxygen to form solid silicon dioxide.

The process is applicable to depositing a fully-reacted compound of any metal and reactive gas when that metal and the reactive gas will react to form a gaseous compound, or a sub-compound of the metal and the reactive gas, at a temperature below the vaporization temperature. As discussed above, the vaporization temperature is the sublimation temperature (if the metal sublimes) or the evaporation temperature (if the metal does not sublime). The ion-assisted reactive gassification process of the present invention is believed to be applicable to depositing oxides of metals such as silicon, molybdenum, tungsten, niobium, tantalum, vanadium, platinum, ruthenium, rhodium, iridium, scandium, titanium, hafnium, germanium, and copper; nitrides of gallium, germanium, and silicon; carbides of silicon and aluminum; selenides, sulphides, antimonides and tellurides of metals such as boron, indium and silicon; carbides of silicon, hafnium and aluminum; and halides of metals such as silver, aluminum, barium, chromium, cerium, copper, erbium, dysprosium, iron, lanthanum, manganese, terbium, and thorium. This list should however not be considered as exhaustive.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DETAILED DESCRIPTION OF THE INVENTION

Figure 1:
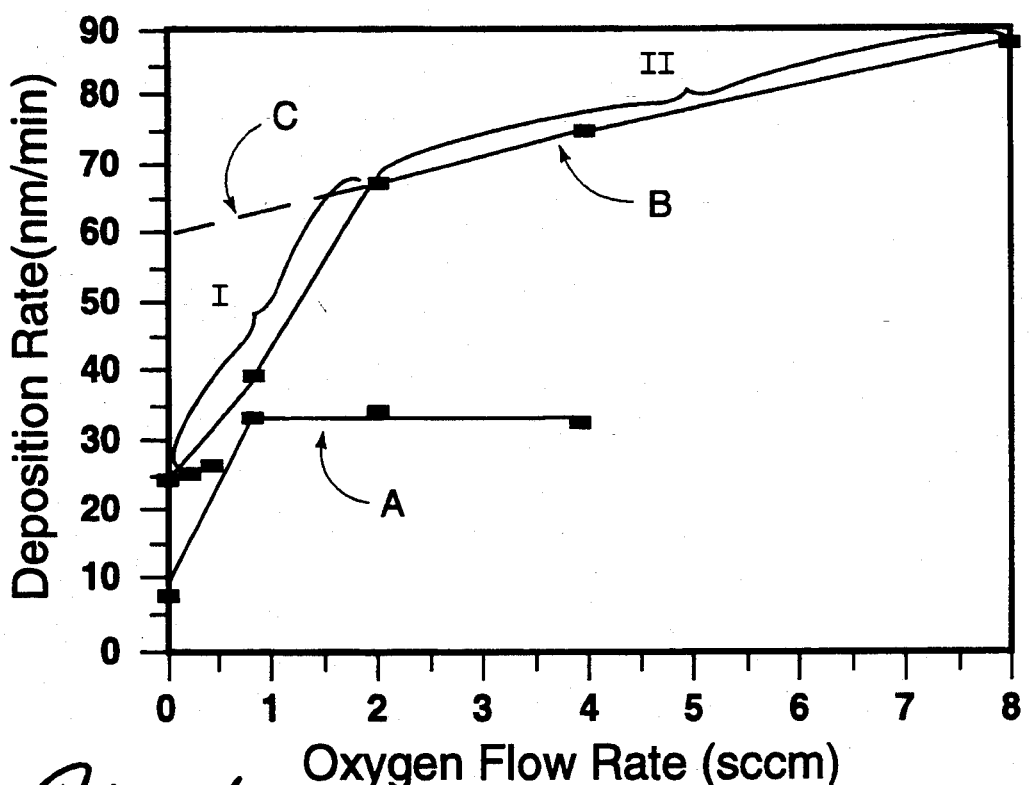
FIG. 1 is a graph schematically illustrating deposition rate of silicon dioxide as a function of oxygen flow-rate for hot and cold sputtering targets in one embodiment of the present invention.

The present invention is directed to depositing, in vacuum at a predetermined pressure, a fully reacted compound of a metal and a reactive gas by first reacting a surface of the metal, above a critical temperature, with the reactive gas to form a gaseous compound or sub-compound of the metal. The gaseous compound or sub-compound is then reacted with the reactive gas on a substrate surface to accumulate a solid layer of the fully reacted compound on that surface. The metal may be in solid or liquid form during the reaction. The reaction temperature is preferably below the evaporation or sublimation temperature of the metal at the predetermined pressure.

The method of the present invention may be referred to as reactive sublimation or reactive gassification. The latter description is probably the more scientifically accurate. Sublimation is a term usually applied to a case where a bulk solid vaporizes without going through an intermediate liquid phase. As will be appreciated from the detailed description below, in the method of the present invention, it is most probable that a bulk compound never actually forms on the metal surface above the critical temperature. Rather, the gaseous compound or sub-compound is desorbed from the metal surface. The method of the present invention is, however, sublimation like, in that the compound or sub-compound is not evolved from a bulk liquid state.

Before describing a particular embodiment of the method, it is instructive to consider mechanisms of such a reaction with regard to the oxidation of a silicon target under vacuum.

In a paper "Reaction of Oxygen with Si(111) and (100): Critical Conditions for the Growth of SiO₂", F. W. Smith and G. Ghidini, J. Electrochemical Society, Vol 129, pp 1300–1306 (1982) are described experiments carried out to find optimum conditions for growing a silicon dioxide (SiO₂) passivating layer on a silicon wafer. It was determined that at temperatures above a certain critical temperature (Tc), SiO₂ would no longer grow on the silicon wafer, and, in fact, the silicon wafer was etched by the oxygen. The etching results from the formation of volatile (gaseous) silicon monoxide (SiO), a sub-oxide of silicon, instead of fully reacted SiO₂.

It is suggested that growth of SiO₂ is prevented by a reaction:

$$Si(solid) + SiO_2(solid) \rightarrow 2SiO(gas) \quad (1)$$

Briefly, without being limited to a particular theory, it is believed that reaction of molecular oxygen ($O_2$) with a silicon surface at a temperature higher than Tc proceeds by the following pathway:

$$O_2(gas) + Si(solid) \xrightarrow{S_{O2}} I_1 \xrightarrow{k_1} I_2 \xrightarrow{k_2} SiO(gas) \quad (2)$$

where $S_{O2}$ is the reaction probability, $I_1$ is an intermediate which has been identified with chemisorbed $O_2$, $I_2$ is the second intermediate, believed to be adsorbed atomic oxygen (O), and $k_1$ and $k_2$ are the corresponding reaction rate coefficients. The reaction with atomic oxygen is believed to proceed as follows:

$$O(gas) + Si(solid) \xrightarrow{S_o} I' \xrightarrow{k'} SiO(gas) \quad (3)$$

where $S_O$ is the reaction probability, $I'$ is an adsorbed intermediate believed to be the same as $I_2$ and $k'$ is the reaction rate coefficient. The sublimation rate of SiO from Si at temperatures above Tc due to reaction of Si with molecular oxygen can be described by an equation:

$$R_{SiO,O2} = 2S_{O2}R_{O2} \quad (4)$$

where $R_{O2}$ is the $O_2$ flux density, given by a formula:

$$R_{O2} = 5.8 \times 10^{-2} P(MT)^{-\frac{1}{2}} [moles/cm^2.sec] \quad (5)$$

where M is the molecular weight of oxygen (=32 g/mole), T is the gas temperature in degrees Kelvin, and P is the partial pressure of $O_2$ in Torr. It may be assumed for the sake of simplicity that the gas temperature is about 300° K. This is because $R_{O2}$ is only a weak function of T, and the mean free path at exemplary reaction pressures of between about four and eight milliTorr (4 and 8 mTorr) is sufficiently long that walls of a vacuum chamber in which the reaction takes place will significantly cool the gas.

For values of reaction temperature between about 1250° K. and 1500° K., it may be assumed that $S_{O2}$ has a value of about 0.025. For atomic oxygen, however, the reaction probability $S_O$ is essentially unity in a temperature range between about 1250° K. and 1500° K. If a fraction $\eta$ of $O_2$ molecules which impinge on the silicon surface are dissociated, the arrival rate $R_O$ of atomic oxygen on the surface is about $2\eta R_{O2}$, and the total sublimation rate $R_{SiO}$ of SiO from the silicon surface will be given by an equation:

$$R_{SiO} = 2[\eta + (1-\eta)S_{O2}]R_{O2} \quad (6)$$

Clearly it would be advantageous for increasing sublimation of SiO to actually supply atomic oxygen, by activating oxygen using an ion source, a plasma device or the like, rather than relying solely on dissociation of molecular oxygen on the hot silicon surface. In an intense oxygen plasma atomic oxygen production may approach fifty percent of the total oxygen in the plasma. Further, the atomic oxygen would be advantageous in reacting SiO with oxygen on a substrate to form the desired SiO₂ layer. In one preferred embodiment, the method of the present invention is carried out in a reactive sputtering apparatus using a silicon sputtering target, preferably a magnetron sputtering apparatus. The intense plasma created by a magnetron conveniently provides a source of atomic oxygen for increasing the sublimation rate of SiO and also for accelerating reaction of SiO and oxygen on a substrate. Sputtering current is used to heat the silicon target to a temperature above the critical temperature $T_c$ at which sublimation of SiO will take place.

In one example of the above-discussed embodiment, the sputtering device was an "Onyx-2" circular planar magnetron manufactured by Angstrom Science Inc. of Pittsburgh, Pa. A silicon target having a diameter of about 5.0 centimeters (cm) and a thickness of about 0.05 cm was used. Current was fixed at about 0.5 Amperes (0.5 A) with a corresponding voltage of 280 Volts (280 V). A substrate was located at about 14.0 cm from the target.

It was anticipated that some contribution to the accumulation or deposition rate of an $SiO_2$ layer on the substrate due to reactive sputtering of silicon from the target would occur. Accordingly, an experiment to determine the sputtering rate as a function of oxygen flow at constant power for a cooled (cold) target (at about 300° K.) was performed. For this "cold-target" experiment, the target was thermally bonded to a water-cooled backing plate with gallium metal.

For experiments in which the target was heated, the target was held in place by a ring clamp but not thermally bonded to the backing plate. The temperature of the heated target, in the racetrack area of the magnetron, was measured using an optical pyrometer to be about 1500° K. Other portions of the target, both inside and outside of the racetrack area had a temperature below the lower measurement limit of the pyrometer, i.e, below about 1200° K. The area of the target heated to about 1500° K. was about 6.2 square centimeters ($cm^2$).

A chamber containing the magnetron was pumped to a base pressure below about $8 \times 10^{-7}$ Torr prior to each deposition cycle. An oxygen/argon mixture was introduced through flow controllers into an external mixing manifold, and a downstream valve was used to control pressure. All experiments were carried out at a constant total gas flow of about 40 standard cubic centimeters per minute (40 sccm) at sputtering pressures of about 4.0 mTorr and 8.0 mTorr. The oxygen/argon mixture was delivered to the chamber at a point therein remote from the magnetron.

Figure 2:
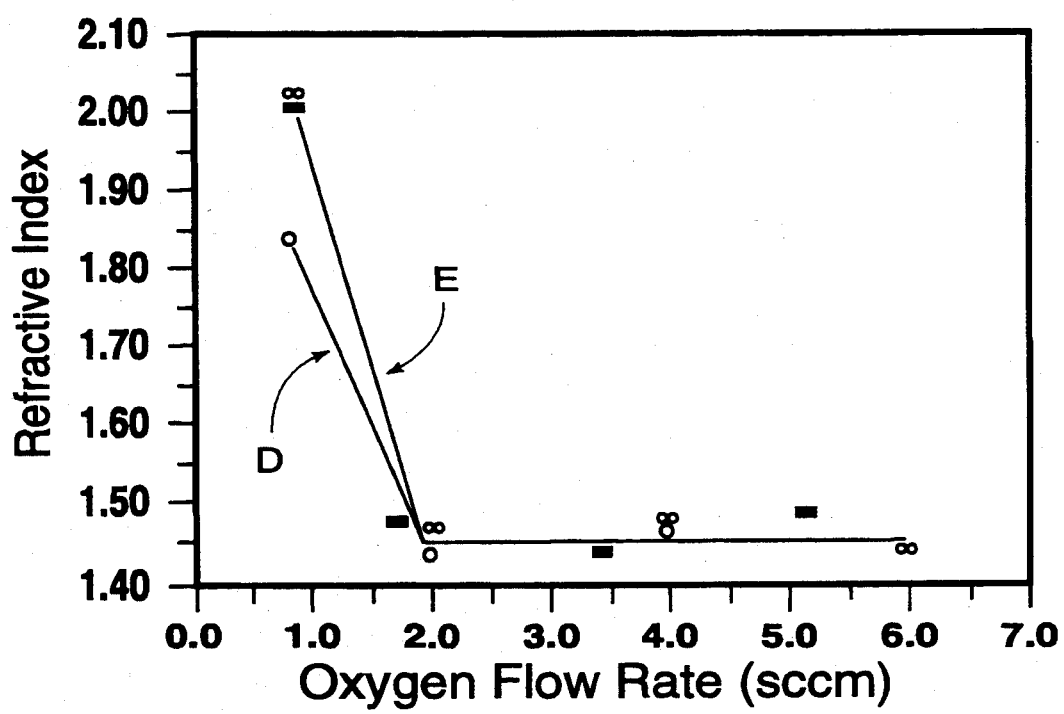
FIG. 2 is a graph schematically illustrating refractive index of silicon dioxide as a function of oxygen flow-rate for layers deposited from the hot and cold targets of FIG. 1.

FIG. 1 illustrates the measured deposition or accumulation rate of $SiO_x$ on the substrate as a function of oxygen flow-rate for a 300° K. (Curve A) target and a 1500° K. (Curve B) target. It should be noted here that for oxygen flow-rates less than 2 sccm, layers deposited from both hot and cold targets were non-stoichiometric, i.e., x (in $SiO_x$) was less than 2. For higher flow-rates, all layers were stoichiometric $SiO_2$. This can be seen from FIG. 2, wherein the refractive index as a function of oxygen flow-rate for both 300° K. (Curve D) and 1500° K. (Curve E) targets is shown.

It can be seen that, for the cold target, deposition rate reached a maximum at an oxygen flow-rate less than one sccm, and remained essentially constant at higher flow-rates up to about 4 sccm. It is pointed out that, at flow-rates higher than 4 sccm, it is to be expected that deposition rate would fall as a result of silicon oxide accumulation on the cathode.

Curve B of FIG. 1 shows that, for the 1500° K. target, deposition rate rises continuously with oxygen flow-rate at a constant power. At a flow-rate of 8 sccm it is about three times the deposition rate from the cold target at the same power, and there is no indication that the rate has reached a maximum.

Curve B may be considered in two regions I and II. Region I has the steeper slope and is the region wherein there is a contribution to the deposition rate of $SiO_2$ from both oxidation of sputtered silicon and from (reaction) oxidation of sublimed SiO on the substrate. Region I of curve B intercepts the y axis at a value of about 25 nm/min which represents the sputtering rate for pure silicon. Based on this figure, a calculated deposition rate for silicon dioxide produced only by essentially fully oxidizing the silicon would be 57 nm/min. Extrapolating region II of curve B to meet the y axis of the graph (broken line C) provides an intercept at about 62 nm/min which agrees relatively closely with the theoretical prediction. This tends to confirm that increasing deposition rate in region II of curve B is due to increasing sublimation of SiO only.

At an oxygen flow of about 8 sccm, the contribution of sputtering to the total deposition rate is about 60 percent, and the contribution from ion assisted sublimation is about 40 percent. The role played by atomic oxygen in enhancing the sublimation rate may be evaluated as set forth below.

The sputtering of Si from the target is independent of the flow-rate of $O_2$, and corresponding to the measured rate of 25 nm/min is equal to about $2.1 \times 10^{-7}$ mole/$cm^2 \cdot$min. For flows above 2.0 sccm, where the $SiO_2$ deposit is essentially fully reacted, contribution to $SiO_2$ deposition rate due to Si sputtering would be 57.0 nm/min, as noted above. Added to this is the sublimation contribution $R_e$ which is given by an equation:

$$R_e = AR_{SiO}M_{SiO_2}/2\pi\rho pD^2 \quad (7)$$

where A ($=6.2$ cm2) is the racetrack area, $M_{SiO_2}$ ($=60$ grams/mole) is the molecular weight of $SiO_2$, $\rho(=2.2$ gram/$cm^3$) is the density of the $SiO_2$ deposit and D ($=14.0$ cm) is the target to substrate distance.

Combining the above results provides:

$$R_e = 9.7 \times 10^4[\eta + (1-\eta)S_{O2}]P[nm/min] \quad (8)$$

Using a measured conductance of 127 Liters/see equation 7 may be expressed in terms of flow-rate:

$$R_e = 9.7[\eta + (1-\eta)S_{O2}]F \text{ [nm/min]} \quad (9)$$

where F is the $O_2$ flow-rate expressed in units of seem. Thus the deposition rate as a function of $O_2$ flow-rate (Region II of Curve B)), in theory, should be a straight line with an intercept of 57 nm/min and a slope of $R_e = 9.7[\eta + (1-\eta)S_{O2}]$ nm/min.sccm. As indicated above, experimental results provide an intercept at 62 nm/min and a slope of 2.6 nm/min.sccm. Using a value for $S_{O2}$ of 0.025 as discussed above, provides an apparent value for $\eta$ of 0.25 which is within the anticipated range for production of atomic oxygen by activating molecular oxygen in an highly ionized plasma.

Continuing now with a discussion of results obtained at higher oxygen flow-rates, in another experimental deposition chamber, a sputtering device was provided by a sputtering gun obtainable from Sputtered Films Inc. of Santa Barbara, Calif. A silicon target was supported on graphite pins such that it was thermally but not electrically isolated from the sputtering gun's cooling system. The target was configured such that at a sputtering power of one Kilowatt (1 KW) it would reach a temperature of about 1370° K. An argon/oxygen mixture flow-rate was fixed at a value of about 200 sccm and oxygen flow-rate varied by varying the ratio of argon to oxygen in the mixture.

Figure 3:
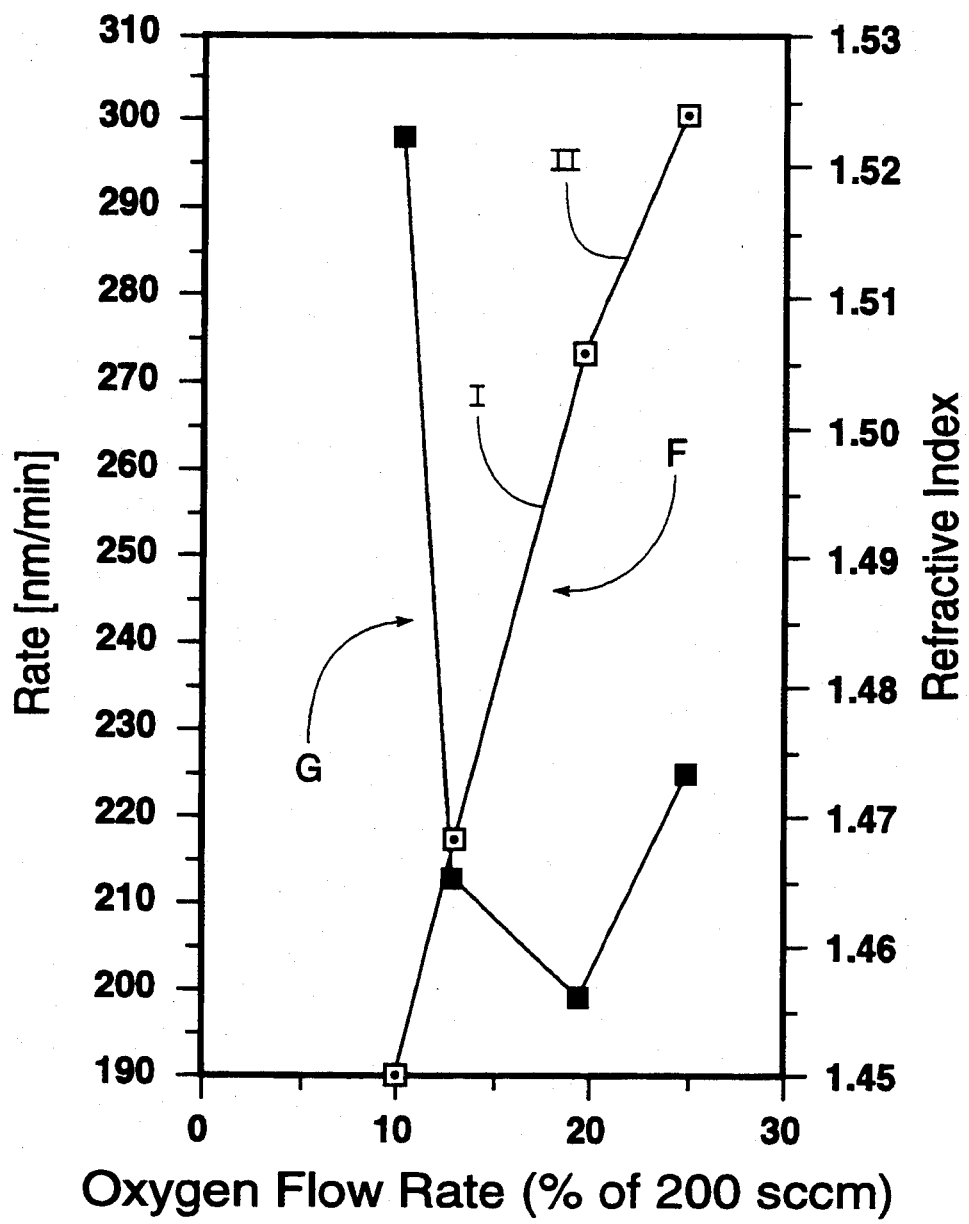
FIG. 3 is a graph schematically illustrating deposition rate and refractive index of silicon dioxide as a function of oxygen flow-rate over a hot sputtering target in another embodiment of the present invention.

The experimental results are depicted graphically in FIG. 3 wherein deposition rate (Curve F) of $SiO_2$ and refractive index (Curve G) of the $SiO_2$ deposited are plotted as a function of $O_2$ flow-rate. It should be noted that deposition rate Curve F has two distinct regions I and II corresponding to the same regions of Curve B of FIG. 1. The junction of the regions occurs at a flow-rate of 40 sccm of $O_2$. Extrapolating region II provides an intercept on the y axis (not shown) of about 170 nm/min. This means that at 50 sccm the contribution to deposition rate from sublimation of SiO was about 45 percent and the contribution from reactive sputtering of Si was about 55 percent. The slope of curve F in region II thereof is about 3.2 nm/min.sccm, indicating a somewhat higher dissociation (activation) efficiency $\eta$ of the sputtering device compared with the sputtering device used to produce the results of FIG. 1. This efficiency, however, is still not at the limit of what may be achieved in a suitably designed plasma system.

In both of the above described series of experiments, absolutely no arcing was observed in the racetrack region of the silicon target where the target temperature had exceeded the critical value $T_c$. At higher $O_2$ rates than those depicted in FIGS. 1 and 2, arcing was observed in areas outside the racetrack area, where the temperature was below $T_c$. As far as arcing is concerned, there is no indication that if a target were configured such that the entire target surface could be heated above $T_c$, oxygen flow could be increased to produce a corresponding increase in sublimation contribution to deposition rate.

It should be noted that if the power level and total flow-rate of oxygen argon remained constant, sputtering contribution to the rate would not change significantly, as argon and oxygen are almost equally effective in sputtering. In the experimental arrangement of FIG. 3, an increase in $O_2$ flow to 50 percent of the total would cause the sublimation contribution to deposition to be almost equal to the contribution from reactive sputtering. Expressed in other terms, total deposition rate would be twice the rate available from sputtering alone for the same power.

Many magnetron sputtering-cathode concepts may be used to provide a suitable ion assisted reactive gassification source for carrying out the method of the present invention at very high oxygen flow-rates. It is pointed out, however, that in the experimental arrangements of FIGS. 1 and 3, only a fraction of the atomic oxygen produced by the sputtering plasma reaches the substrate. Accordingly, in order to take advantage of very high reactive gassification rates, it may be necessary to provide a separate source of monatomic oxygen, such as an ion gun or the like, immediately adjacent to or directed at the substrate.

Figure 4:
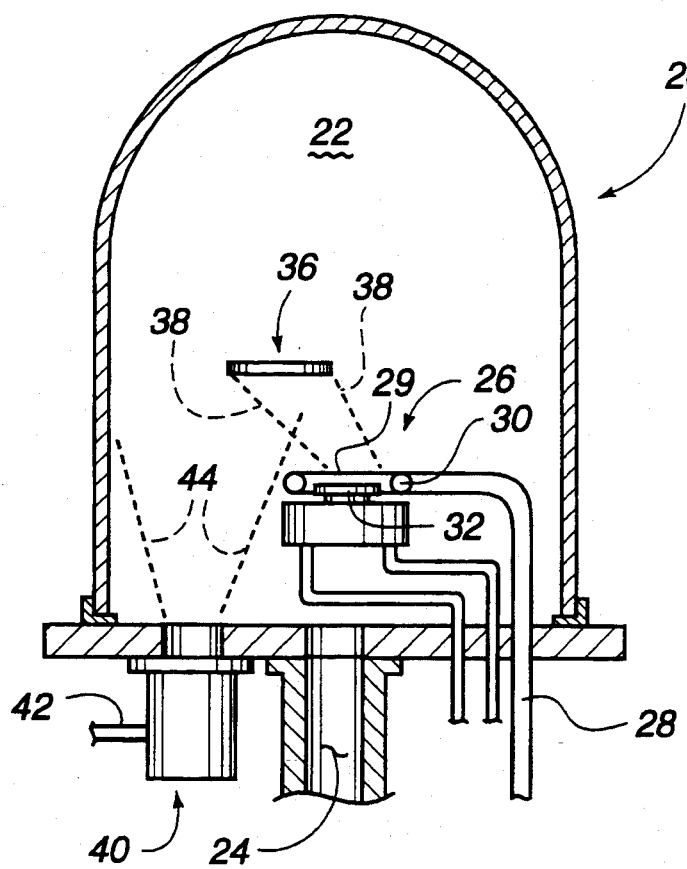
FIG. 4 schematically illustrates one arrangement of deposition apparatus suitable for practicing the method of the present invention, including a magnetron ion-source providing a heated target and a supplementary ion source for accelerating reaction at a substrate.

Such an arrangement is illustrated in FIG. 4. Here, a deposition apparatus 20 includes an evacuated enclosure 22, which is evacuated via a port 24. A magnetron sputtering-cathode/ion-source 26 is supplied with a mixture including reactive gas via an inlet conduit 28 and a manifold 30. When the magnetron ion-source is activated, an intense plasma including the reactive gas is created in region 29 immediately above a target 32 to be sublimed. Material sublimed from target 32 impinges on substrate 36, as indicated by broken lines 38. A supplementary ion-source or ion-gun 40 is supplied with reactive gas via a conduit 42 and directs activated reactive gas towards substrate 36 as illustrated by broken lines 44. Details of electrical-connections, water-connections, and internal support fixturing for apparatus 20 and components thereof are well known to those familiar with the art to which the present invention pertains. Accordingly, a description of such details is not presented here.

Figure 4B:
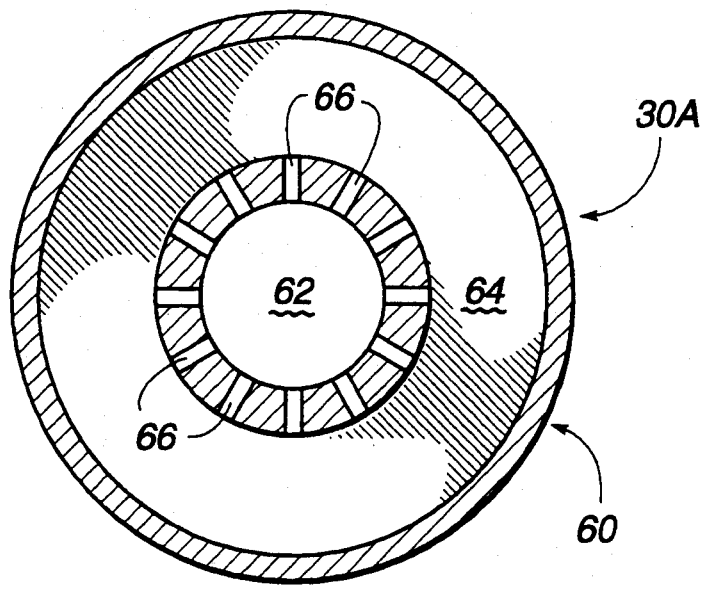
FIG. 4B is a cross-section view seen generally in the direction 4B—4B of FIG. 4A schematically illustrating further details of the ring manifold of FIG. 4A.
Figure 4A:
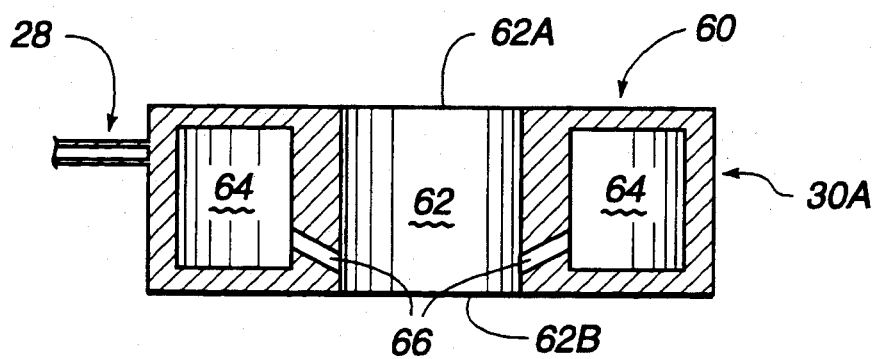
FIG. 4A is a general cross-section view schematically illustrating a ring manifold for delivering reactive gas to a circular target.

In FIG. 4 manifold 30 is illustrated as a simple ring manifold. An alternate manifold arrangement 30A is illustrated in FIGS. 4A and 4B. Manifold 30A may be used instead of a single ring manifold when it is desired to maintain a locally high gas pressure between target and substrate for more efficiently directing reactive gas to the substrate. Manifold 30A includes annular manifold body 60 which defines a central, open-ended, cylindrical chimney 62, having an upper end 62A and lower end 62B. Within body 60 is an annular gas plenum 64. Plenum 64 is supplied with gas via inlet conduit 28. Gas from plenum 64 is delivered towards target 32 (not shown in FIGS. 4A and 4B) via twelve equispaced holes or jets 66. Jets 66 are inclined downward from plenum 64 toward target 32 at an angle of about fifteen degrees and are arranged to deliver gas as close as practically possible to end 62B of chimney 60.

In one embodiment (for a circular target having a diameter of about 5.0 cm), chimney 62 has a diameter of about 5.0 cm and a height of about 5.0 cm. It is preferably located concentrically over the target, with end 62B located about 3.00 millimeters (mm) from the target.

Figure 5:
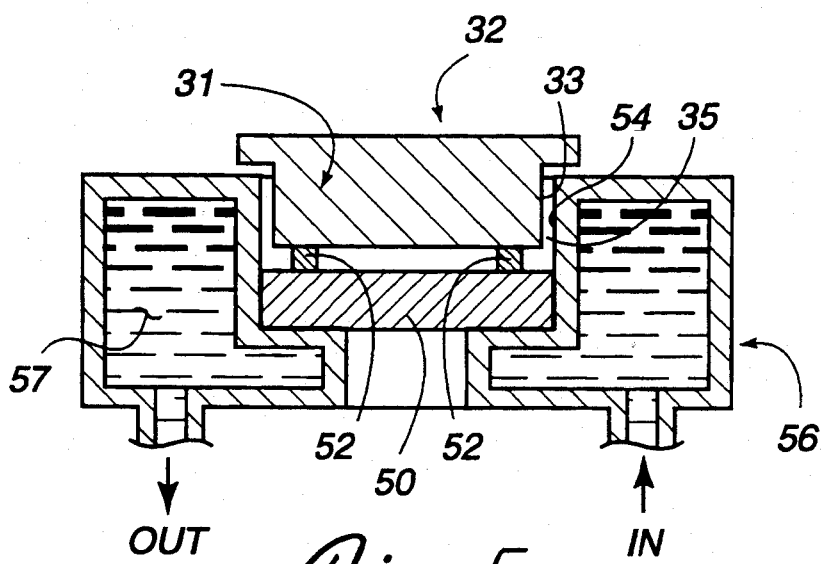
FIG. 5 is a general cross-section view schematically illustrating a portion of a circular planar magnetron including means for maintaining a target of the magnetron at a desired high operating temperature.

Referring now to FIG. 5, one method of controlling target temperature in apparatus of the type illustrated in FIG. 4 is shown. Target 32 is supported on an aluminum block 50 by at least three graphite pins 52 (only two visible in FIG. 5). Block 50 tightly contacts inner wall 54 of a water cooling jacket 56. Portion 33 of target 32, however, is arranged to fit loosely within water jacket 56 leaving a gap 35 between the target and wall 54.

Pins 52 are sufficiently electrically-conductive to allow electrical connection (not show) to be made to target 32 via block 50. Pins 32 however are poor thermal conductors. When a magnetron sputtering-cathode-/ion-source device including target 32 (see device 26 of FIG. 4) is activated, ion bombardment of target 32 heats the target, causing it to expand. Gap 35 may be arranged such that, at a predetermined desired operating temperature, portion 33 of target 32 contacts wall 54 of cooling jacket 56, thus establishing good thermal contact with the jacket. Heat created by increasing passage of current is swept away by flowing cooling water 57 thus preventing a further rise in temperature.

Figure 6:
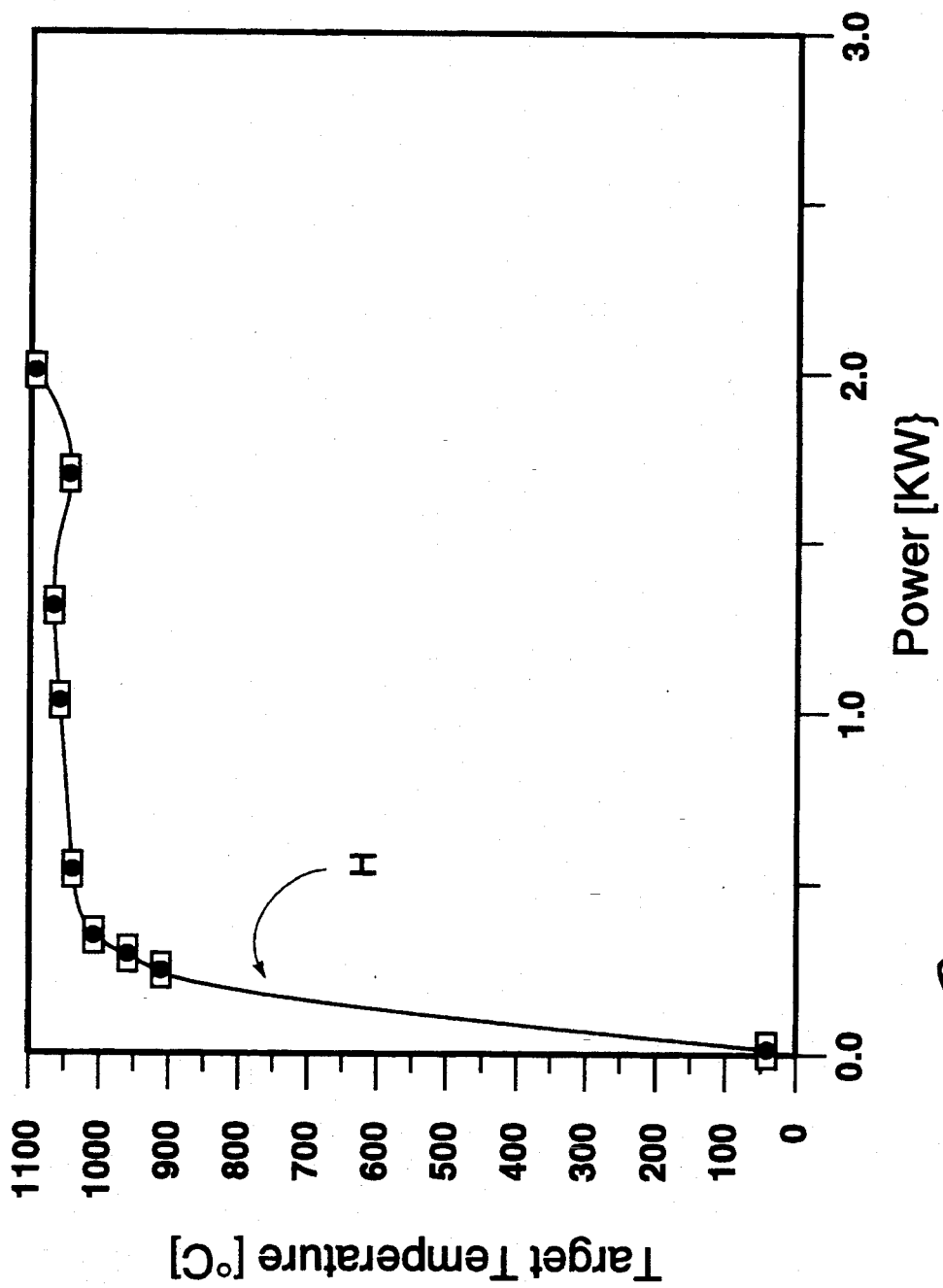
FIG. 6 is a graph schematically illustrating temperature as a function of operating power for one example of the target arrangement of FIG. 5.

FIG. 6 illustrates target temperature as a function of operating power (Curve H) for an experimental tantalum target in an arrangement of the type illustrated in FIG. 5. The target was sized to contact the jacket at a temperature of 1060 degrees Centigrade (1060° C.). It can be seen that for operating powers between about 0.25 KW and 1.75 KW temperature is essentially invariant with power, and very close to the design temperature for the target.

Figure 7:
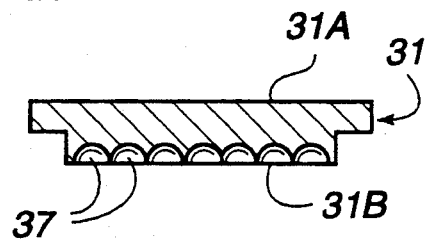
FIG. 7 is a general cross-section view through a sputtering target, the temperature of which is radiatively controlled.

Another method of maintaining a high target temperature, using essentially only radiation cooling, is illustrated in FIG. 7. Here, a target 31 is provided with a plane front surface 31A, from which reactive gassification will occur, and a textured rear surface 31B. Texture may be in the form, for example, of corrugations or dimples 37. Generally, temperature of target 31 will be determined, among other factors, by operating power, the ratio of area of surface 31B to the area of surface 31A, and the thickness of the target, i.e., the distance between surfaces 31A and 31B. In a practical case, some conduction losses from support fixtures, electrical connections, and the like will affect target temperature. This can be minimized however, for example, as described above for target 32.

Figure 8:
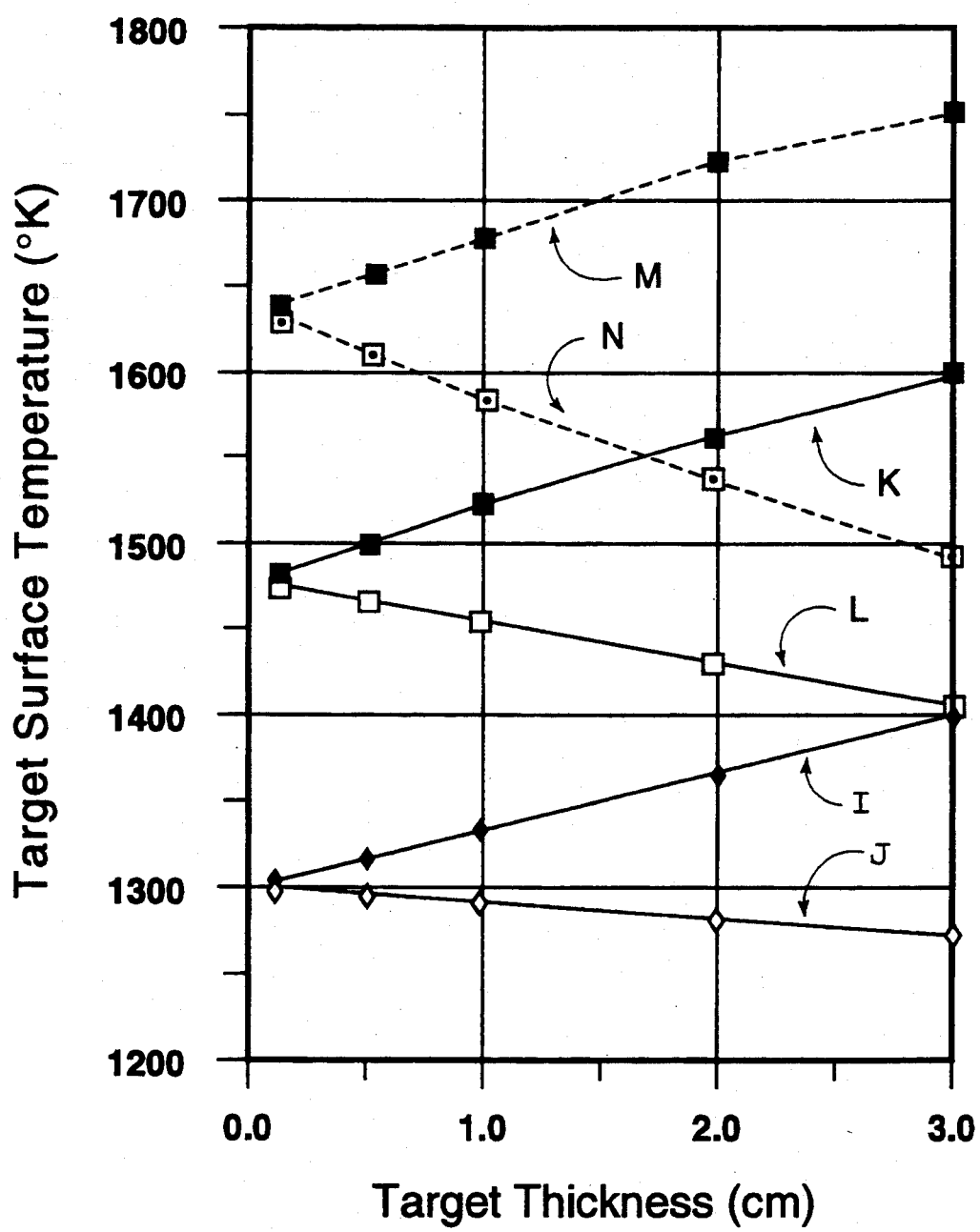
FIG. 8 is a graph schematically illustrating computed front and rear target temperatures as a function of surface area ratio and target thickness at constant power for a silicon target of the type illustrated in FIG. 7.

Referring now to FIG. 8, computed front and rear surface temperatures are shown as a function of target thickness for a silicon target having various rear:front surface area ratios and operated at a constant power density of 40 Watts/cm$^2$. Conduction losses are ignored in the computation. Curves I and J respectively represent front and rear surfaces having an area ratio of 4:1; Curves K and L respectively represent front and rear surfaces having an area ratio of 2:1; and Curves M and N respectively represent front and rear surfaces having an area ratio of 1:1.

It is emphasized here, that while for the hot target there is a sputtering contribution to the deposition rate of SiO$_2$ on a substrate from a conventional reactive sputtering mechanism, the method of the current invention, when practiced using a sputtering device, may provide a contribution from sublimed SiO reacting with monatomic oxygen which may easily be at least equal to, and perhaps two or more times greater than, the contribution from sputtering. As pointed out above, the sputtering process simply provides a convenient means for heating the target and for providing an ion source for activating the flowing gas. The atomic oxygen containing plasma activates, in particular, the gassification reaction, but also accelerates the oxidation reaction on the substrate.

There does not appear to be any reason not to believe that, were the target heated by means other than sputtering high deposition rates would be achievable entirely from ion assisted gassification. A target may be heated, for example, by resistance heating or electron bombardment from an electron-beam gun, and atomic oxygen provided by a separate gas activation arrangement, such as an ion-gun, induction coil, plasma transport system, or the like.

Figure 9:
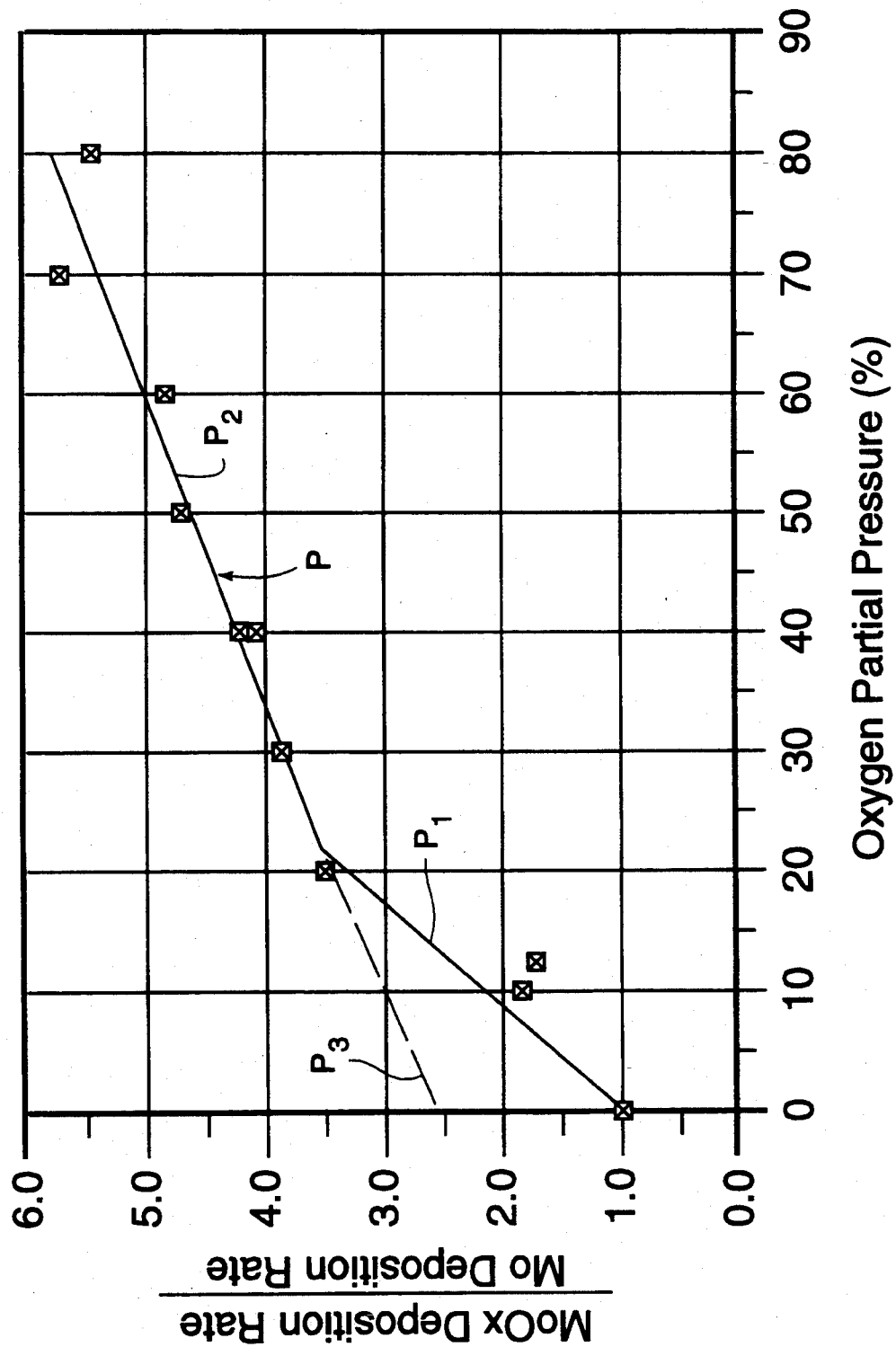
FIG. 9 is a graph schematically illustrating deposition rate of molybdenum oxide from a molybdenum target as a function of oxygen flow rate at a constant target temperature.

In another example of the process of the present invention molybdenum oxide was sublimed from a molybdenum magnetron-sputtering target, using oxygen (in an oxygen argon mixture) as a reactive gas. It is believed here, without being limited by such an assumption, that molybdenum oxide in gaseous form was formed directly from a reaction between oxygen and a solid metallic molybdenum target. Turning now to FIG. 9, relative deposition rate of molybdenum oxide/molybdenum is shown (Curve P) as a function of percentage oxygen partial pressure in an oxygen argon mixture. The mixture was delivered via the manifold of FIGS. 4A and 4B located at about 3.0 mm above the molybdenum target. A substrate was located at about 7.5 cm above the target, i.e. at about 2.5 cm above upper end 62B of the manifold chimney. An auxiliary ion source directed at the substrate was not used. Total gas pressure was held at about 8.0 mTorr and power was held at about 400 Watts. Target temperature was about 1500 degrees Centigrade.

It can be seen from FIG. 9 that curve P has the same form as curve B (for silicon) of FIG. 1. A fast rising portion P$_1$ of curve P represents a region where deposition rate due to sputtering is increasing primarily as sputtered molybdenum is increasingly oxidized with increasing oxygen content of the sputtering gas mixture. An oxygen percentage of about 20.0 percent is sufficient to fully oxidize sputtered molybdenum. At higher oxygen percentages, indicated by section P$_2$ of curve P, deposition rate of molybdenum oxide increases entirely due to sublimation of molybdenum oxide from the target. If section P$_2$ of curve P is extrapolated, as indicated by broken line P$_3$, to intercept the y axis of the plot of FIG. 9, the intercept value of between about 2.5 and 3.0 indicates the contribution to molybdenum oxide deposition rate from oxidation of sputtered molybdenum. At an oxygen percentage of about 80.0 percent, contribution to molybdenum oxide deposition rate from ion-assisted gassification is greater than the contribution from sputtering. It is believed that if apparatus were configured to deliver more monatomic oxygen to the heated molybdenum target than was delivered in the above described experiments, reactive gassification contribution could be significantly greater.

It should be noted that the ion-assisted reactive gassification method of the present invention may not be applicable to all compounds. The method is only effective for depositing a desired compound of a metal and a reactive gas, when the reactive gas will react with the solid metal at a reaction temperature which is above a critical temperature at which the metal will react with the reactive gas to form the compound or a sub-compound of the metal and the reactive gas in a gaseous form. The reaction temperature is preferably below the evaporation or sublimation temperature of the metal. In most practical cases, the critical temperature will be greater than about half of the melting point of the metal.

For certain low melting point metals such as gallium, aluminum, and indium, the critical temperature will be greater than the melting point of the metal. The reactive gassification process will be most effective when the compound or a sub-compound formed in the reactive gassification process has a vapor pressure at least two times higher than the metal. In such cases, even when the metal is molten during the reactive gassification process the reactive deposition would be the primary contributor to deposition rate of the compound on a substrate.

Set forth below is a list of compounds which can be formed by reactive gassification and which have a reactive gassification rate at least two orders of magnitude higher than the evaporation rate of the parent metal at the critical temperature. The compounds are identified, for brevity, only by their chemical formula.

Al$_4$C$_3$, AlF$_3$, BaCl$_2$, BaF$_2$, B$_2$S$_3$, CeF$_3$, CrBr$_2$, CrCl$_3$, CuCl, Cu$_2$O, CuS, DyF$_3$, ErF$_3$, GaN, Ge$_3$N$_2$, GeO$_2$, HfC, HfO$_2$, InSb, In$_2$S, FeBr$_2$, LaF$_3$, MnBr$_2$, MnCl$_2$, MoO$_3$, NbO, PdO, PtO$_2$, IrO$_2$, RhO$_2$, RuO$_2$, Re$_2$O$_7$, Sc$_2$O$_3$, SiC, SiO, Si$_3$N$_4$, SiSe, SiS, SiTe$_2$, AgI, Ta$_2$O$_5$, TbF$_3$, ThF$_3$, TiO$_2$, and V$_2$O$_5$. In the foregoing list, at least Al$_4$C$_3$, AlF$_3$, BaCl$_2$, BaF$_2$, GaN, InSb, and In$_2$S would be formed by the reactive gassification process from metals which would be molten at the critical temperature T$_c$.

The process of the present invention has been described here as applicable to deposition of oxides of silicon and molybdenum from these metals using oxygen as the reactive gas. It is believed that an oxide of a metal from the group consisting of silicon, molybdenum, tungsten, niobium, tantalum, vanadium, platinum, ruthenium, rhodium, iridium, scandium, titanium, hafnium, germanium, and copper can be formed from a target including that metal and oxygen. A nitride of a metal selected from the group consisting of gallium, germanium, and silicon, may be formed from a target of the metal and a reactive gas including nitrogen such as elemental nitrogen or ammonia. A carbide of a metal selected from the group consisting of silicon, hafnium and aluminum may be formed from a target of the metal and a reactive gas including carbon, such as methane. A selenide, sulphide, telluride or antimonide of a metal from the group consisting of indium, silicon or boron, may be formed from a target including that metal and a reactive gas including an element selected from the group consisting of selenium, sulfur and antimony. Examples of such reactive gases include hydrogen selenide, hydrogen sulphide, hydrogen telluride, and, hydrogen antimonide. Finally but not exhaustively, a halide of a metal selected from the group consisting of silver, aluminum, barium, chromium, cerium, copper, erbium, dysprosium, iron, lanthanum, manganese, terbium, and thorium may be formed from a target including that metal and a reactive gas including a halogen, such as hydrogen chloride, hydrogen bromide, hydrogen iodide or hydrogen fluoride.

In summary, a deposition method for metal compounds has been described which provides significantly higher deposition rates for those compounds than prior art reactive sputtering methods. Deposition rate may be quickly and precisely regulated, for example, simply by regulating flow of reactive gas. In an in-line sputtering apparatus this can significantly reduce the volume of defective product which is produced during layer thickness adjustment.

Very high deposition rates are achieved by the ion-assisted sublimation method without a requirement for power input greater than prior art methods. Applied to an in-line coating apparatus, for example, it is possible that a product produced at a given rate for a given power input by conventional reactive sputtering technology could be produced at the same rate by ion-assisted sublimation using only a tenth of the power. This can be effective in reducing product cost and saving natural resources.

The present invention has been described and depicted as in the form of preferred and other embodiments. The invention however is not limited to the embodiments described and depicted. Rather, the invention is limited only by the appended claims.

What is claimed is:

1. A method of vacuum depositing a compound of a metal and a reactive first gas, the metal having a vaporizing temperature which is one of an evaporation temperature and a sublimation temperature, the method comprising the steps of:
   (a) providing a vacuum chamber and means for evacuating the chamber;
   (b) providing means for admitting a controlled flow of the first gas into the chamber;
   (c) providing a target of the metal within the vacuum chamber;
   (d) providing a plasma source for activating the reactive gas;
   (e) providing a substrate in the chamber for accumulating a layer of the metal compound;
   (f) admitting the first gas into the chamber at a predetermined flow-rate;
   (g) activating said plasma source to activate the first gas;
   (h) heating the target to a predetermined reaction temperature at which that the first gas reacts with the metal target to form a second gas, said reaction temperature being less than the vaporization temperature of the metal, and said second gas including at least one of the compound of the metal and the first gas and a sub-compound of the metal and the first gas; and
   (g) while maintaining the target at about said reaction temperature, reacting said second gas and the first gas on said substrate to accumulate a layer of the compound in solid form.

2. The method of claim 1 wherein the compound is accumulated on said substrate at a predetermined rate, and said predetermined rate is increased by increasing said flow-rate of the first gas and decreased by decreasing said flow-rate of the first gas.

3. The method of claim 1 wherein said metal target forms the target of a sputtering-cathode and said sputtering-cathode provides a first ion source.

4. The method of claim 3 wherein said sputtering cathode is a magnetron sputtering-cathode.

5. The method of claim 4 further including providing a second ion source for activating said reactive gas, and directing said second ion source at said substrate.

6. The method of claim 1 wherein the metal is silicon, the compound is silicon dioxide, the reactive gas includes oxygen, and the sub-compound is silicon monoxide.

7. The method of claim 6 wherein the predetermined temperature is between about 1000 and 1450 degrees Centigrade.

8. The method of claim 1 wherein the metal is molybdenum, the first gas is oxygen, and the compound is molybdenum oxide.

9. The method of claim 1 wherein the metal includes an element selected from the group consisting of silicon, molybdenum, tungsten, niobium, tantalum, vanadium, platinum, ruthenium, rhodium, iridium, scandium, titanium, hafnium, germanium, and copper and the first gas is oxygen.

10. The method of claim 1 wherein the metal includes an element selected from the group consisting of gallium, germanium, and silicon; and the first gas includes nitrogen.

11. The method of claim 1 wherein the metal includes an element selected from the group consisting of indium, silicon, and boron and the first gas includes an element selected from the group consisting of selenium, sulfur, tellurium, and antimony.

12. The method of claim 1 wherein the metal includes an element selected from the group consisting of silver, aluminum, barium, chromium, cerium, copper, erbium, dysprosium, iron, lanthanum, manganese, terbium, and thorium and the first gas includes a halogen.

13. The method of claim 1 wherein the metal includes an element selected from the group consisting of silicon, hafnium, and aluminum and the first gas includes carbon.

14. A method of vacuum depositing silicon dioxide comprising the steps of:
   (a) providing a vacuum chamber and means for evacuating the chamber and maintaining the chamber at a predetermined pressure;
   (b) providing means for admitting a controlled flow of oxygen into the chamber;
   (c) providing a sputtering device including a metallic silicon target within the vacuum chamber, said sputtering-cathode configured such that when activated said target reaches a predetermined reaction temperature at which silicon will react with oxygen at the predetermined pressure to form a gaseous sub-oxide of silicon;

(d) providing a substrate in the chamber for accumulating a layer of the silicon dioxide;

(e) admitting oxygen into the chamber at a predetermined flow-rate;

(f) activating the sputtering device thereby heating the target to the reaction temperature and reacting the target with the oxygen to provide the gaseous sub-oxide of silicon; and (g) while maintaining the chamber at the predetermined pressure and while maintaining the target at the predetermined temperature, reacting the gaseous suboxide of silicon and the oxygen on the substrate to accumulate a layer of solid silicon dioxide.

15. The method of claim 14 wherein the reaction temperature is greater than half the melting point of silicon and less than the vaporization temperature of silicon at the predetermined pressure.

16. A method of vacuum depositing solid molybdenum oxide comprising the steps of:

(a) providing a vacuum chamber and means for evacuating the chamber and maintaining the chamber at a predetermined pressure;

(b) providing means for admitting a controlled flow of oxygen into the chamber;

(c) providing a sputtering device including a metallic molybdenum target within the vacuum chamber, said sputtering-cathode configured such that when activated said target reaches a predetermined reaction temperature at which molybdenum will react with the oxygen at the predetermined pressure to form gaseous molybdenum oxide;

(d) providing a substrate in the chamber for accumulating a layer of the solid molybdenum oxide;

(e) admitting oxygen into the chamber at a predetermined flow-rate;

(f) activating the sputtering device thereby heating the target to the reaction temperature and reacting the target with the oxygen to provide the gaseous molybdenum oxide; and (g) while maintaining the target at the reaction temperature, reacting the gaseous oxide of molybdenum and the oxygen on the substrate to accumulate a layer of solid molybdenum oxide.

17. The method of claim 16 wherein the reaction temperature is greater than half the melting point of molybdenum and less than the vaporization temperature of molybdenum at the predetermined pressure.

* * * * *